United States Patent [19]

Loughlin

[11] Patent Number: 4,879,757

[45] Date of Patent: Nov. 7, 1989

[54] TWEET ELIMINATION, OR REDUCTION, IN SUPERHETERODYNE RECEIVERS

[75] Inventor: Bernard D. Loughlin, Centerport, N.Y.

[73] Assignee: Hazeltine Corp., Greenlawn, N.Y.

[21] Appl. No.: 46,754

[22] Filed: May 7, 1987

[51] Int. Cl.⁴ ............................................. H04B 1/16
[52] U.S. Cl. .................................... 455/182; 455/183; 455/260; 455/310
[58] Field of Search ............... 455/182, 180, 185, 186, 455/166, 168, 195, 183, 259, 260, 255, 310, 296; 331/10, 18

[56] References Cited

U.S. PATENT DOCUMENTS

| | | | |
|---|---|---|---|
| 4,542,533 | 9/1985 | Parker | 455/182 |
| 4,598,422 | 7/1986 | Fellman | 455/180 |
| 4,601,060 | 7/1986 | Wine | 455/182 X |
| 4,709,406 | 11/1987 | Omoto | 455/182 X |
| 4,761,825 | 8/1988 | Ma | 455/260 |

Primary Examiner—Robert L. Griffin
Assistant Examiner—Ralph E. Smith
Attorney, Agent, or Firm—E. A. Onders

[57] ABSTRACT

In a superheterodyne receiver which employs a frequency synthesizer to generate local oscillator (LO) frequencies, there is provided apparatus which determines when an undesirable frequency relation exists, which may produce a condition known as a "tweet", and which adjusts the frequency of the LO signal so as to prevent, reduce or eliminate the tweet.

6 Claims, 1 Drawing Sheet

TWEET ELIMINATION, OR REDUCTION, IN SUPERHETERODYNE RECEIVERS

FIELD OF THE INVENTION

This invention relates to superheterodyne receivers which employ a frequency synthesizer to generate the local oscillator frequencies required by the receiver's frequency converter, or mixer, in which the received radio frequency (RF) signal is converted to a corresponding intermediate frequency (IF) signal.

BACKGROUND OF THE INVENTION

In superheterodyne receivers, a relatively common problem is an undesired output, interfering with the desired outputs, which interference may occur when the receiver is tuned to a signal whose carrier frequency is very close to being an integral multiple of the receiver's intermediate frequency. The IEEE Standard Dictionary of Electrical and Electronics Terms [ANSI/IEEE STD 100-1984, Third Edition Aug. 10, 1984, published by the Institute of Electical and Electronics Engineers] on pp. 458–459 defines the phenomenon as follows: "Intermediate-frequency-harmonic interference (superheterodyne receivers). Interference due to radio-frequency-circuit acceptance of harmonics of an intermediate-frequency signal." In IEEE STD 185-1975 [(IEEE/IHF Standard), Standard Methods of Testing Frequency Modulation Broadcast Receivers] on p. 24, Section 6.22-Regeneration, it is noted that this type of interference is called "tweet", a term that has been widely used in the receiver industry for many years and is used herein. While the condition may occur in any type of superheterodyne receiver, it has been particularly troublesome in amplitude-modulation (AM) receivers designed for reception of signals in the AM broadcast band (535-1605 kHz). However, the invention is not limited to application in receivers of that type only, but is also applicable to superheterodyne receivers designed for other frequency bands, and for types of modulation other than AM. For purposes of clarity, receivers of sound intelligence, such as AM radio receivers, will be used as the basis of the ensuing discussion.

In the past, radio receivers have employed continuous tuning, whereby a receiver could be tuned uninterrupted across the frequency band, or have used push-button arrangements which enabled the listener to tune incrementally to preselected stations. In either case, if the receiver were tuned to a signal whose carrier frequency was very nearly an integral multiple of the receiver's intermediate frequency (IF), an annoying interfering tweet would occur if there were sufficient undesired regenerative coupling or feedback between the receiver's IF circuits and the antenna or RF circuits.

More recently, synthesized frequency generation has become increasingly popular for providing the local oscillator frequency required by a superheterodyne receiver's frequency converter, in which the received signal frequency is converted to an intermediate frequency.

Frequency synthesizers for superheterodyne receivers may employ a variety of design approaches, but generally have some features in common, such as: (1) a frequency-stable master oscillator operating at a first reference frequency from which the desired frequencies are derived, and (2) the capability to provide in incremental steps the local oscillator frequencies required by the superheterodyne receiver's frequency converter to receive signals broadcast on any assigned frequency in the frequency band for which the receiver was designed.

Frequency synthesizers generally provide a more precise frequency for the frequency converter than was provided by earlier tuning systems. In the special case where the received signal frequency is a harmonic of the IF, a frequency synthesizer theoretically could provide a synthesized frequency which would result in an IF which was an exact integral submultiple of the signal frequency, provided the signal carrier was also at its exact specified frequency. In this case, if there were the regenerative paths in the receiver required to produce tweet, the tweet, being at zero frequency, would not be heard. However, because of normal tolerances in receiver components, thermal and aging effects, and allowable tolerances in signal frequencies, the occurence of the zero-tweet condition just described is highly unlikely, and in normal operation tweet can be expected to be observable in the receiver's output.

It is, therefore, an object of the present invention to provide in a superheterodyne receiver equipped with synthesized-frequency tuning, means to detect frequency relations which may produce a tweet, and to automatically change the IF in a direction which prevents, reduces or eliminates the tweet.

SUMMARY OF THE INVENTION

The present invention is applicable in a superheterodyne receiver for preventing or reducing an undesirable frequency relation which may exist between a received radio frequency (RF) signal and the receiver's intermediate frequency (IF) signal. Such a receiver includes first means for supplying a local oscillator (LO) signal at selected different frequencies and whose specific actual frequency can be controlled, and for also supplying a second signal representative of the nominal intermediate frequency.

The receiver also includes second means for supplying a received RF signal, and third means for combining the RF signal and the LO signal to develop an IF signal within a predetermined IF band.

In addition, the receiver includes fourth means, responsive to the second signal and the IF signal, for developing a control signal representative of the existance of the undesirable frequency relation between the RF signal and the IF signal. Finally, the receiver includes means for applying the control signal to the first means, for controlling the frequency of the LO signal so as to prevent or reduce the undesirable frequency relation.

For a better understanding of the present invention, together with other and further objects, reference is made to the following description, taken in conjunction with the accompanying drawing, and its scope will be pointed out in the appended claims.

DESCRIPTION OF THE INVENTION

Figure 1:
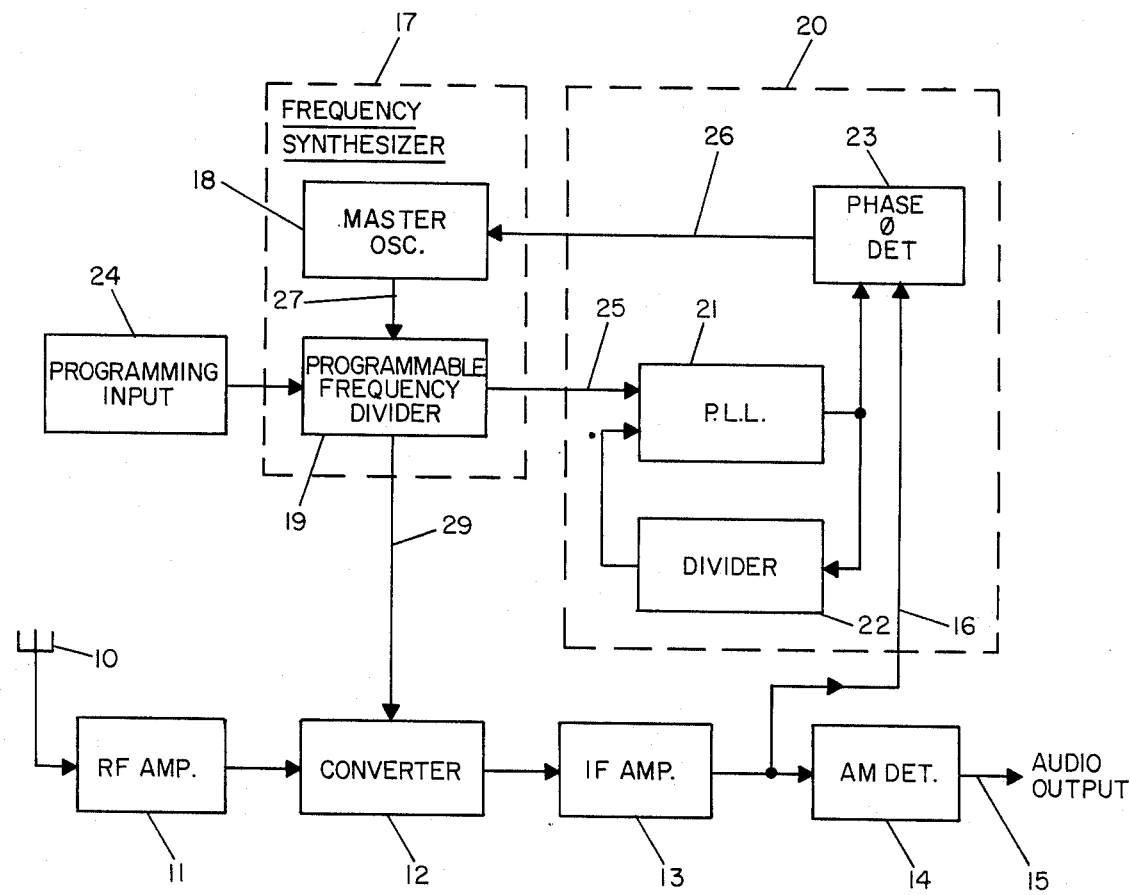
FIG. 1 is a block diagram of an AM receiver embodying the invention in one form.

The operation of the circuit represented by the block diagram of FIG. 1 will be described first, and then a mathematical analysis will be presented to verify operation of the invention as described.

In FIG. 1, master oscillator 18 in frequency synthesizer 17 is the source of a first reference-frequency signal which is coupled via lead 27 to programmable frequency divider 19. This divider can be programmed to provide, one at a time, local oscillator (LO) signal frequencies required by the receiver's frequency converter 12 to tune to signals from broadcast stations operating at assigned frequencies in the frequency band for which the receiver was designed.

The control signal from program source 24 to frequency divider 19 determines the frequency of the LO output signal from the divider on lead 29. Apparatus suitable for developing a programming control signal to divider 19 may be of several types. For example, it may be operated manually, as part of the receivers tuning apparatus, to tune incrementally from channel to channel. Alternatively, it may provide for automatically scanning up or down from one received station to another, or only to preselected stations. Combinations of these methods also may be used. Whichever method is used, apparatus 24, which controls divider 19 to make channel selection via converter 12, usually is also ganged with any tuning apparatus for the antenna 10 and/or radio-frequency (RF) circuits 11.

Blocks 10 through 14 in FIG. 1 operate in the normal manner of a superheterodyne receiver. RF signals are picked up by antenna 10 and coupled to the RF circuits 11, which normally include bandpass filtering and amplification. In frequency converter 12 the RF signal is converted to a corresponding IF signal, which is amplified in IF amplifier 13 and coupled to AM detector 14. The detected signal is then coupled via lead 15 to audio amplifiers, if required, and then to sound reproducing apparatus, such as loudspeakers.

What has been described thus far is a conventional superheterodyne receiver equipped with frequency synthesized tuning. The addition of control unit 20 provides the functions required to develop a control signal which is coupled via lead 26, to master oscillator 18 to cause the master oscillator's first reference frequency on lead 27 to change in a direction which will prevent, reduce or eliminate a tweet which may occur when the received signal frequency is nominally an integral multiple of the IF.

Programmable frequency divider 19, in addition to providing LO signals on lead 29 at the frequencies required by frequency converter 12, also develops a signal at a second reference frequency which is coupled, via lead 25, to phase-locked-loop (PLL) 21. The second reference frequency may be an integral submultiple of the IF, as in FIG. 1. The free-running frequency of the oscillator in PLL 21 is nominally equal to the IF, and the divisor (n) of divider 22 is an integer equal to the ratio of the nominal IF to the nominal second reference frequency. Such circuits are well known to those skilled in the art, and it will be recognized that the PLL oscillator will be locked to a frequency which is (n) times the second reference frequency.

The output from PLL 12 is a signal at a third reference frequency which is coupled to phase detector 23 and to divider 22. Also coupled to the phase detector is the IF signal from the output of IF amplifier 13. Phase detector 23 develops a control signal which is representative of the difference in frequency between the third reference frequency signal from PLL 21 and the IF signal from IF amplifier 13.

Master oscillator 18 is a stable, frequency-controlled oscillator (such as a voltage or current controlled oscillator). The control signal developed by phase detector 23 is coupled via lead 26 to the frequency-control input of the master oscillator, and thereby causes the master oscillator's first reference frequency output on lead 27 to change. The change in the first reference frequency will result in changes in the second reference frequency on lead 25 and in the frequency of the LO signal on lead 29. As a result, the third reference frequency from PLL 21 and the frequency of the IF signal on lead 16 will change in a direction which causes them to become equal in the preferred embodiment or very nearly equal in another embodiment. It will be shown that when the frequencies of these two signals become equal, the tweet frequency becomes zero.

To facilitate mathematical analysis of the operation of the invention, symbols for frequencies at various points in FIG. 1 are defined in the following Table, along with their interrelationships for three sets of conditions.

Column A of the Table shows relationships that exist when the master oscillator 18 in frequency synthesizer 17 is at the exact design center frequency, the received RF signal frequency is at the exact assigned frequency for a particular radio station and is an exact integral multiple of the IF. The relationships under these conditions would exist whether the invention is operative or not.

The relationships in Column B of the Table are for a condition where either or both the master oscillator and the received signal frequencies are not at their design center, or specified, frequencies and the invention is not operative, such as would be the case, for example, if phase-detector 23 were inoperative. In this case, the IF would not be an integral submultiple of the RF signal frequency and a tweet would exist.

With conditions as described above for Column B of the Table, with the exception that the invention is now made operative, the relationships will be as shown in Column C of the Table. The invention will operate in a manner which causes the IF to become an integral submultiple of the received signal frequency, thereby reducing the tweet to zero frequency.

TABLE

| Parameter | A<br>Signal & Master Oscillator<br>Frequencies At Design Center | B<br>Signal & Master Osc. Frequencies Not At Design Center<br>Invention Not Operative | C<br><br>Invention Operative |
| --- | --- | --- | --- |
| RF Signal Frequency | $f_s$ | $f_s'$ | $f_s'$ |
| First Reference Frequency on lead 27 | $f_{1R}$ | $f_{1R}'$ | $f_{1R}''$ |
| Intermediate Frequency on lead 16 | $f_i$ | $f_i'$ | $f_i''$ |
| "Local Oscillator" Frequency on lead 29 for Frequency Converter 12 | $f_{LO}$ | $f_{LO}'$ | $f_{LO}''$ |

TABLE-continued

| Parameter | A<br>Signal & Master Oscillator<br>Frequencies At Design Center | B<br>Signal & Master Osc. Frequencies Not At Design Center<br>Invention Not Operative | C<br><br>Invention Operative |
|---|---|---|---|
| Second Reference Frequency on lead 25 | $f_{2R}$ | $f_{2R}'$ | $f_{2R}''$ |
| (1) $K_1 =$ | $\dfrac{f_{1R}}{f_{LO}}$ | $\dfrac{f_{1R}'}{f_{LO}'}$ | $\dfrac{f_{1R}''}{f_{LO}''}$ |
| (2) $K_2 =$ | $\dfrac{f_{1R}}{f_{2R}}$ | $\dfrac{f_{1R}'}{f_{2R}'}$ | $\dfrac{f_{1R}''}{f_{2R}''}$ |
| (3) $K_3$ (Integer) = | $\dfrac{f_s}{f_i}$ | — | $\dfrac{f_s'}{f_i''}$ * |
| (4) $K_4 =$ | $\dfrac{f_i}{f_{2R}}$ | — | $\dfrac{f_i''}{f_{2R}''}$ |

*Proven mathematically below, that integer relationship ($K_3$) exists between RF signal frequency ($f_s$) and intermediate frequency ($f_i''$) as a result of operation of the invention.

The following mathematical analysis shows that the tweet is, indeed, reduced to zero frequency by operation of the invention. From equation (4C) above, when the invention is operative, $$f_i'' = K_4 f_{2R}'' \tag{5}$$

Also, by superheterodyne action, $$f_i'' = f_{LO}'' - f_s' \tag{6}$$

and, $$\frac{f_s'}{f_i''} = \frac{f_{LO}''}{f_i''} - 1 \tag{7}$$

Making substitution from equation (5) in (7)

$$\frac{f_s'}{f_i''} = \frac{f_{LO}''}{K_4 f_{2R}''} - 1 \tag{8}$$

Making substitutions from equations (1C) and (2C) in 8, $$\frac{f_s'}{f_i''} = \left( \frac{f_{1R}''}{K_1} \cdot \frac{1}{K_4} \cdot \frac{K_2}{f_{1R}''} \right) - 1 \tag{9}$$

Making substitutions from equations (1A), (4A) and (2A) in (9), $$\frac{f_s'}{f_i''} = \left( \frac{f_{LO}}{f_{1R}} \cdot \frac{f_{2R}}{f_i} \cdot \frac{f_{1R}}{f_{2R}} \right) - 1 \tag{10}$$

$$= \frac{f_{LO}}{f_i} - 1 \tag{11}$$

But, $$f_{LO} = f_s + f_i \tag{12}$$

Making substitution from equation (12) in (11).

$$\frac{f_s'}{f_i''} = \frac{f_s + f_i}{f_i} - 1 \tag{13}$$

Therefore $\dfrac{f_s'}{f_i''} = \dfrac{f_s}{f_i} = K_3$, an integer. (14)

In the Table, it should be noted that through the action of frequency divider 19 in frequency synthesizer 17, $K_1$ and $K_2$ are fixed constants, regardless of whether the invention is operative or not, and regardless of whether or not the signal and master oscillator frequencies have drifted from their specified values. However, $K_3$ is a fixed integer only for the special conditions specified above for Column A, or, as will be shown mathematically below, when the invention is operative, as specified for Column C. Also, $K_4$ is a fixed constant only for the conditions specified for Columns A and C. $K_4$ is the divisor (n) in divider 22 in FIG. 1.

It will be apparent that for the tweet frequency to be reduced to zero, phase-detector 23 in the preferred embodiment of FIG. 1 acts in the normal manner to cause the third reference frequency from PLL 21 and the IF signal on lead 16 to lock at the same frequency. In this case, the control signal output from phase detector 23, on lead 26, contains a DC component, and until the two inputs to phase detector 23 become equal in frequency, an AC component is also present. If only the AC component of the control signal output of phase-detector 23 is coupled to the master oscillator 18 control input, the phase detector would be the equivalent of a frequency detector instead of a phase detector, and while the tweet frequency will be reduced, it will not necessarily become zero. This is so because the frequencies of the two input signals to phase detector 23 are not necessarily brought into a locked condition, and a small residual frequency difference may exist. However, the difference frequency will be small, and the tweet frequency will be in the subaudible range.

While the invention has been described in the environment of the AM receiver embodiment of Fig. 1, the invention is similarly applicable to the prevention, reduction or elimination of tweets in superheterodyne receivers for other frequency bands and modulation systems, including frequency modulation and video modulation. Also, application of the principles of the invention is not restricted to the circuit of FIG. 1. For example, as mentioned earlier, a frequency synthesizer could be designed to provide a second reference frequency equal to the nominal IF frequency, thereby eliminating the need for PLL 21 and Divider 22 in FIG. 1. The essence of the invention is to develop a control signal which can be used in a manner that causes the tweet frequency to be reduced to zero in the preferred embodiment, or to a low-enough frequency to be inaudible, or at least less objectionable.

While there has been described what is believed to be the preferred embodiment of the present invention, those skilled in the art will recognize that other and further modifications may be made thereto without departing from the spirit of the invention, and it is intended to claim all such changes and modifications as fall within the true scope of the invention.

I claim:

1. In a superheterodyne receiver, having a predetermined intermediate frequency (IF) band and a nominal IF, apparatus for preventing or reducing an undesirable frequency relation which may exist between a received radio frequency (RF) signal and the resulting actual IF signal, comprising:
    first means for supplying a local oscillator (LO) signal at selected different nominal frequencies and whose specific actual frequency can be controlled, and for also supplying a second signal representative of the nominal IF of said receiver, said LO signal and said second signal being derived from a single master oscillator;
    second means for supplying a received RF signal;
    third means for combining said RF signal and said LO signal to develop an IF signal within said IF band;
    fourth means, responsive to said second signal and to said IF signal, for developing a control signal representative of the existance of said undesirable frequency relation between said RF signal and said IF signal;
    and means for applying said control signal to said first means, for controlling the frequency of said master oscillator, and therefore said LO signal, so as to prevent or reduce said undesirable frequency relation.

2. Apparatus according to claim 1, wherein said second signal is an integral submultiple of said nominal IF and is derived from the same source as said LO signal.

3. Apparatus according to claim 1 wherein said second signal is a signal having a frequency equal to said nominal IF and is derived from the same source as said LO signal.

4. Apparatus according to claim 2 or claim 3 wherein said first means includes an oscillator from which said LO signal and said second signal are derived, and wherein said control signal controls the frequency of said oscillator.

5. Apparatus according to claim 1, wherein said fourth means comprises:
    means, responsive to said second signal, for developing a reference signal having a selected frequency in said IF band and a phase which is related to the phase of said second signal;
    and means for detecting the frequency and phase relationship between said IF signal and said reference signal and for developing said control signal representative thereof.

6. Apparatus according to claim 5 wherein said reference signal is developed having a frequency equal to said nominal IF.

* * * * *